(12) United States Patent
Classen

(10) Patent No.: US 9,650,236 B2
(45) Date of Patent: May 16, 2017

(54) MICROMECHANICAL SENSOR DEVICE (71) Applicant: Robert Bosch GmbH, Stuttgart (DE)

(72) Inventor: Johannes Classen, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/747,052

(22) Filed: Jun. 23, 2015

(65) Prior Publication Data

US 2015/0375990 A1 Dec. 31, 2015

(30) Foreign Application Priority Data

Jun. 26, 2014 (DE) ........................ 10 2014 212 314

(51) Int. Cl.
*B81B 3/00* (2006.01)

(52) U.S. Cl.
CPC ...... *B81B 3/0051* (2013.01); *B81B 2207/017* (2013.01); *H01L 2224/83805* (2013.01)

(58) Field of Classification Search
CPC  H01H 59/0009; B81B 3/0072; B81B 3/0021; B81B 7/008; B81C 1/00134; B81C 1/00238; B81C 1/00666; B81C 3/001
See application file for complete search history.

(56) References Cited

U.S. PATENT DOCUMENTS

| 7,250,353 | B2 | 7/2007 | Nasiri et al. |
| 7,442,570 | B2 | 10/2008 | Nasiri et al. |
| 2010/0109102 | A1 | 5/2010 | Chen et al. |
| 2011/0012247 | A1 | 1/2011 | Wu |
| 2011/0049652 | A1 | 3/2011 | Wu et al. |
| 2012/0049299 | A1 | 3/2012 | Chou |
| 2012/0235251 | A1 | 9/2012 | Daneman et al. |
| 2013/0299928 | A1* | 11/2013 | Classen ................. B81B 3/0075 257/417 |
| 2015/0158718 | A1* | 6/2015 | Reinmuth ............. B81C 1/0023 257/415 |
| 2015/0266723 | A1* | 9/2015 | Chan ........................ H04R 1/08 381/173 |

FOREIGN PATENT DOCUMENTS

| DE | 10 2007 048 604 | 4/2009 |
| DE | 10 2009 000 167 | 7/2010 |
| DE | 10 2009 000 345 | 7/2010 |
| DE | 10 2001 080 982 | 2/2013 |

* cited by examiner

*Primary Examiner* — Fernando L Toledo
*Assistant Examiner* — Neil Prasad
(74) *Attorney, Agent, or Firm* — Norton Rose Fulbright US LLP (57) ABSTRACT

A micromechanical sensor device includes: a MEMS element; an ASIC element; a bonding structure provided between the MEMS element and the ASIC element; a layer assemblage having insulating layers and functional layers disposed alternatingly on one another; a sensing element movable in a sensing direction provided in at least one of the functional layers; a spacing element for providing a defined spacing between the MEMS element and the ASIC element being provided by way of a further functional layer; an abutment element having the spacing element and a first bonding layer being disposed on the sensing element; and an insulating layer being disposed on the ASIC element in an abutment region of the abutment element.

12 Claims, 8 Drawing Sheets

MICROMECHANICAL SENSOR DEVICE

BACKGROUND OF THE INVENTION

1. Field of the Invention

The present invention relates to a micromechanical sensor device and a method for manufacturing a micromechanical sensor device.

2. Description of the Related Art

Micromechanical sensors for measuring, for example, acceleration and rotation rate, are known, and are mass-produced for various applications in the automotive and consumer sectors. MEMS elements, which are manufactured using surface micromechanical methods, are known in particular. Here multiple oxide and polycrystalline silicon layers are deposited on a silicon substrate and patterned. The MEMS wafer is then hermetically sealed with a cap wafer.

Figure 1:
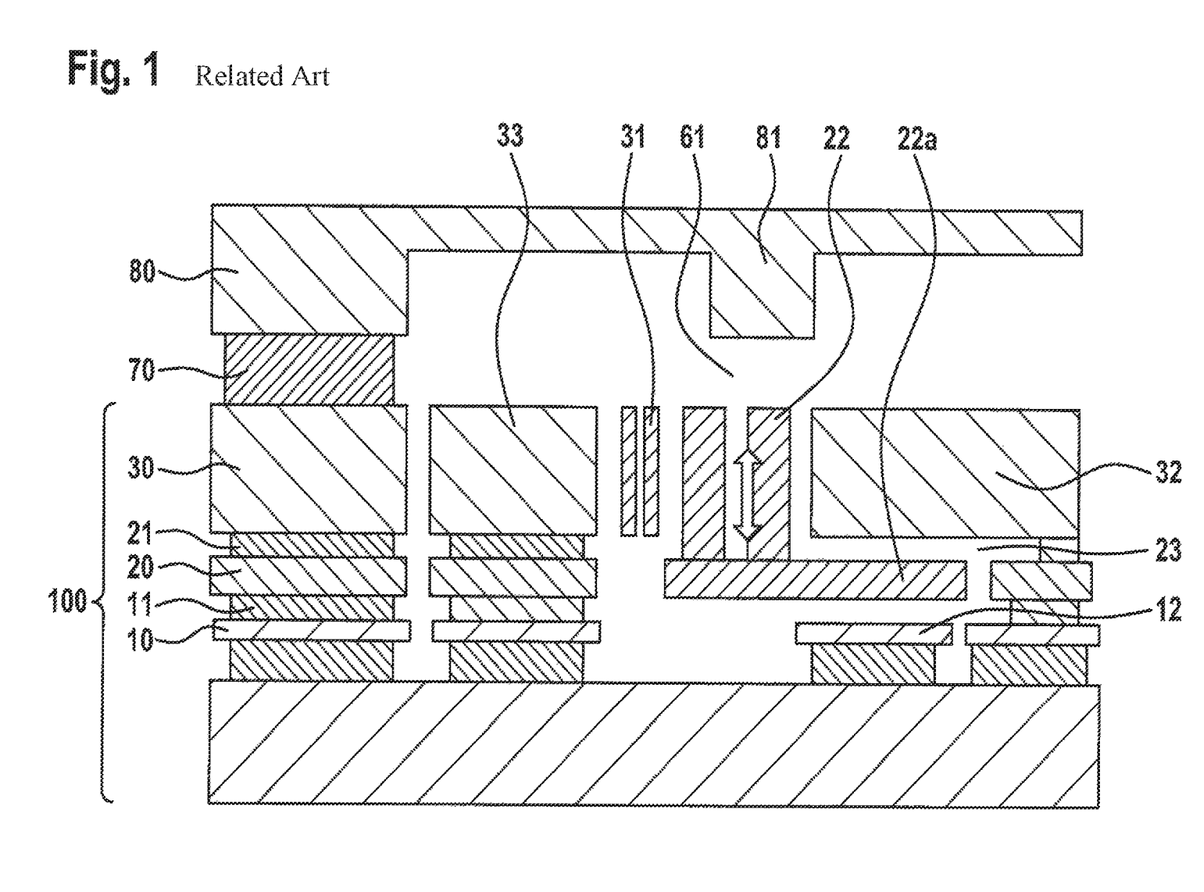
FIG. 1 is a cross-sectional view through a conventional micromechanical sensor device.

FIG. 1 is a cross-sectional view of a conventional surface micromechanical sensor. In this example a MEMS wafer 100 encompasses three functional layers in the form of polysilicon layers 10, 20, 30 that can be patterned largely independently of one another. Oxide layers 11, 21 located respectively between them can be opened at specific sites so that through contacts between polysilicon layers 10, 20, 30 can be implemented. First polysilicon layer 10 functions preferably as an electrical wiring plane; second polysilicon layer 20 and third polysilicon layer 30 can be used both for wiring and in order to implement movable MEMS structures. The MEMS structures are released, for example, by controlled removal of oxide layers 11, 21 beneath polysilicon layers 10, 20, 30 by etching with gaseous HF.

The MEMS element, for example an acceleration or rotation rate sensor, possesses at least one mechanical mount 33, at least one spring assemblage 31, and movable mass elements and electrode elements 22, 32 that, in the example of FIG. 1, are implemented both in second polysilicon layer 20 and in third polysilicon layer 30. A sub-region of movable mass 22 implemented in second polysilicon layer 20 forms, with lower fixed electrode 12 located in first polysilicon layer 10 and upper fixed electrode 32 implemented in third polysilicon layer 30, a capacitor assemblage via gaps 13 and 23.

Specific design topologies for such assemblages are known, for example, from published German patent application document DE 10 2009 000 167 A1 for a Z acceleration sensor, and from published German patent application document DE 10 2009 000 345 A1 for a rotation sensor having detection deflections in a Z direction. The element of third polysilicon layer 30, alternatively to the function as an upper electrode, can also define a mechanical abutment that is preferably at the same electrical potential as the movable MEMS structure.

One problem with such MEMS structures can be the mechanical robustness of the mass element or electrode element implemented in second polysilicon layer 20 when the structure is deflected upward and abuts against the element, located thereabove, of third polysilicon layer 32. In particular when the plane of second polysilicon layer 20 is configured to be relatively thin, for example has a thickness from approx. 1 µm to approx. 3 µm, the risk of a mechanical breakage of the MEMS structure upon occurrence of a large overload ("drop test") is quite high. The Z-abutment 81 implemented in cap wafer 80 is not effective when gap 23 between second polysilicon layer 20 and third polysilicon layer 30 is smaller than gap 61 between the upper side of third polysilicon layer 30 and the lower side of cap abutment 81.

Published German patent application document DE 10 2001 080 982 A1 has proposed, for example, in order to avoid breakage of the structure of second polysilicon layer 20, resiliently mounted structures of third polysilicon layer 30 which can absorb mechanical energy upon abutment and thereby limit the mechanical stresses on second polysilicon layer 20. The layout of these structures is complex, however, and requires additional space.

Also known, for example from U.S. Pat. No. 7,250,353B2, U.S. Pat. No. 7,442,570 B2, U.S. Patent Application Publications U.S. 2010 0109102 A1, U.S. 2011 0049652 A1, U.S. 2011 012247 A1, and U.S. 2012 0049299 A1, and published German patent application document DE 10 2007 048604 A1, are methods for vertical integration or hybrid integration or 3D integration in which at least one MEMS wafer and one evaluation ASIC wafer are mechanically and electrically connected to one another via wafer bonding methods.

Such vertical integration methods are particularly useful in combination with through silicon vias (TSVs) and flip chip technologies, with the result that construction and contacting can be accomplished as a chip-scale package, as known e.g. from U.S. Patent Application Publications U.S. 2012 0049299 A1 and U.S. 2012 0235251 A1.

BRIEF SUMMARY OF THE INVENTION

An object of the present invention is to improve the mechanical robustness of a micromechanical sensor device, in particular a vertically integrated micromechanical sensor device.

The object is achieved according to a first aspect with a micromechanical sensor device having:
a MEMS element, and
an ASIC element, a bonding structure having the MEMS element being constituted between the MEMS element and the ASIC element;
a layer assemblage having insulating layers and functional layers disposed alternatingly on one another, a sensing element movable in a sensing direction being constituted in at least one of the functional layers;
a spacing element for constituting a defined spacing between the MEMS element and the ASIC element being constituted by way of a further functional layer;
wherein an abutment element having the spacing element and a first bonding layer is disposed on the sensing element, an insulating layer being disposed on the ASIC element in an abutment region of the abutment element.

A layer assemblage that is already present is thus used to constitute an abutment element and is disposed on the movable sensing element. This advantageously means effective upward abutment protection with little additional cost, thus furnishing a defined abutment behavior in the Z direction. In an abutment event, abutment thus first occurs in defined fashion on the ASIC wafer. Advantageously, this requires only a slight adaptation of the layout, and no change in the overall process.

According to a further aspect the object is achieved with a method for manufacturing a micromechanical sensor device having the steps of:
furnishing a MEMS element;
furnishing an ASIC element;
constituting a sensing element in the MEMS element, an abutment element being disposed on the sensing element, an insulating layer being constituted on the ASIC element in an abutment region for the abutment element; and constituting a bonding structure between the MEMS element and the ASIC element.

A preferred embodiment of the sensor device provides that the sensing element has a portion constituted orthogonally to the sensing direction. With this configuration of the sensor device, it is advantageously possible to prevent the orthogonal portion from breaking in an abutment event in some circumstances.

A further embodiment of the micromechanical sensor device is notable for the fact that it has at least one electrode interacting with the sensing element. This assists malfunction-free implementation of the functional interaction of the sensing element with the electrode.

A further embodiment of the sensor device is notable for the fact that a spacing of the abutment element with respect to the ASIC element is larger than a detection gap with respect to the electrode. The result of this is that even if an abutment upward should occur, there is no abutment between the abutment element and the electrode.

A further embodiment of the sensor device is notable for the fact that the spacing element has a polysilicon layer. The advantageous result is that a layer already present in the manufacturing process can be used to constitute the spacing element. Dimensioning of the abutment element is preferably accomplished in such a way that a certain defined minimum spacing is present between the MEMS wafer and the ASIC wafer.

A further embodiment of the sensor device is notable for the fact that the first bonding layer of the spacing element is one of the following: germanium, aluminum, metal. A metallic bonding structure for bonding the MEMS wafer to the ASIC wafer can thereby be implemented.

A further embodiment of the sensor device is characterized in that an oxide material is disposed on the ASIC located oppositely from the abutment element in an abutment direction. It is thereby advantageously possible to prevent an electrical short circuit from occurring upon abutment of the movable element against the ASIC. Damage within the sensor device can thereby advantageously be avoided.

A further embodiment of the sensor device is notable for the fact that the sensing element is constituted in a single to functional layer. This advantageously increases design versatility for the sensor device.

The invention will be described in detail below, with further features and advantages, on the basis of several Figures. Identical or functionally identical elements have identical reference characters.

DETAILED DESCRIPTION OF THE INVENTION

The term "defined baseline spacing" is understood hereinafter to mean a spacing between the MEMS element and the ASIC element which ensures that no crosstalk occurs from one wafer to the other.

Figure 2:
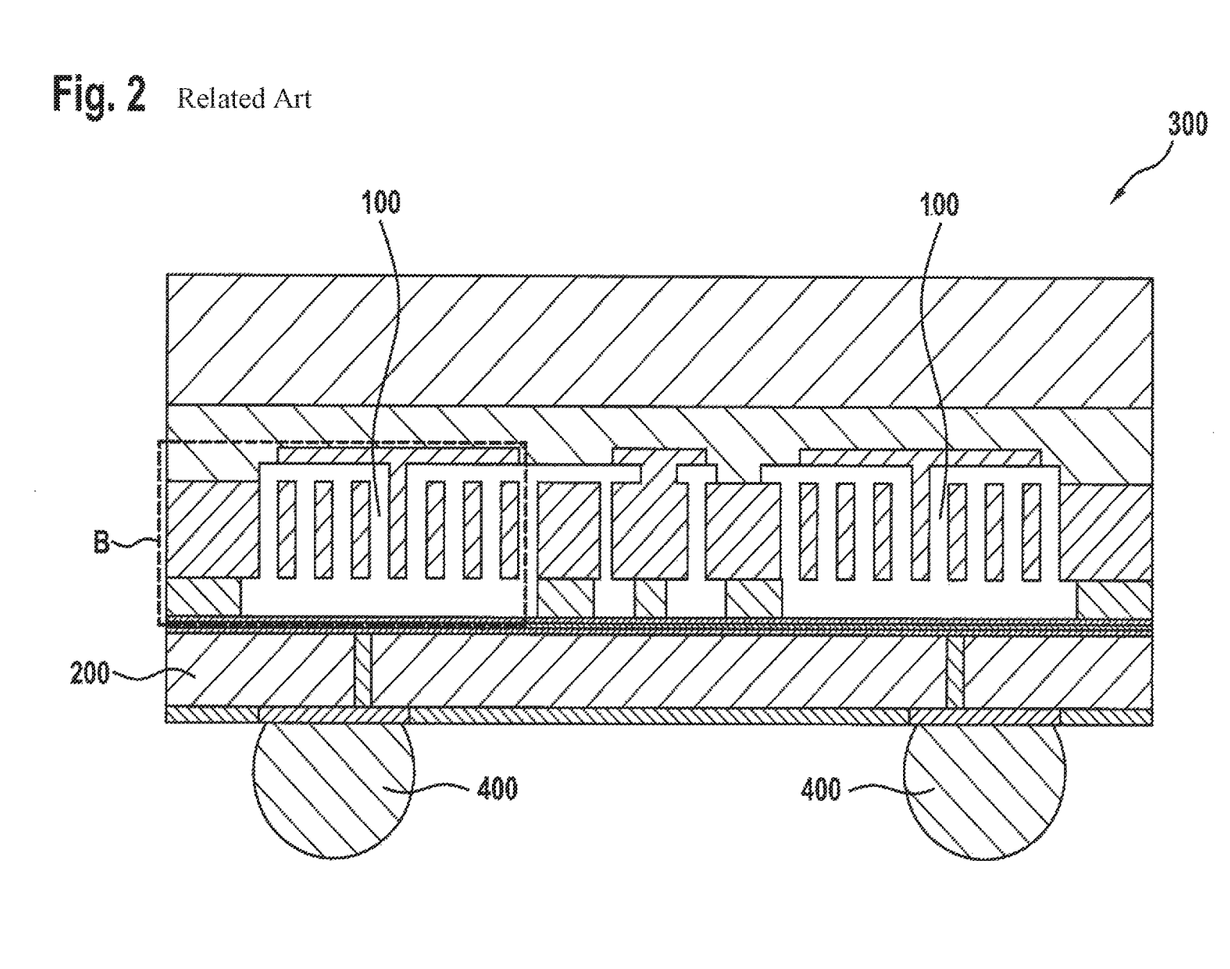
FIG. 2 is a cross-sectional view through a conventionally vertically integrated sensor device.

FIG. 2 shows a known vertical integration concept for a micromechanical component which encompasses a MEMS element 100 made of a MEMS silicon substrate, at least one wiring plane, at least one MEMS functional layer, and several oxide layers grown or deposited thereon. The functional layers can also be applied using wafer bonding methods and subsequent backside grinding. ASIC element 200, which is preferably manufactured with a CMOS process, is made of a silicon substrate, doped semiconductor layers to implement the electrical circuits, and the metal oxide stack in particular for wiring and in order to implement capacitances.

MEMS element 100 and ASIC element 200 are interconnected via a metallic wafer bonding method, e.g. via eutectic bonding of aluminum to germanium. For example, the uppermost aluminum wiring plane on ASIC element 200 is used as a bonding surface, and germanium is deposited on MEMS element 100 as an uppermost layer. The two wafers 100, 200 are then pressed together at temperatures above approx. 430° C. with sufficient pressure that a eutectic liquid phase is produced. The aluminum-germanium join on the one hand brings about hermetic encapsulation of the MEMS structures by way of a peripheral bonding frame, and furthermore enables electrical contacts between MEMS element 100 and ASIC element 200. Other metallic bonding methods, such as copper-tin bonds or thermocompressive methods, are likewise conceivable in principle. External electrical communication to and from ASIC 200 is accomplished preferably, by way of metallic through silicon vias (TSVs) that are opened on the backside of ASIC 200 and then guided via a rewiring plane above an insulating layer and solder balls 400 to an application circuit board (not depicted), for example in a mobile telephone.

Figure 3:
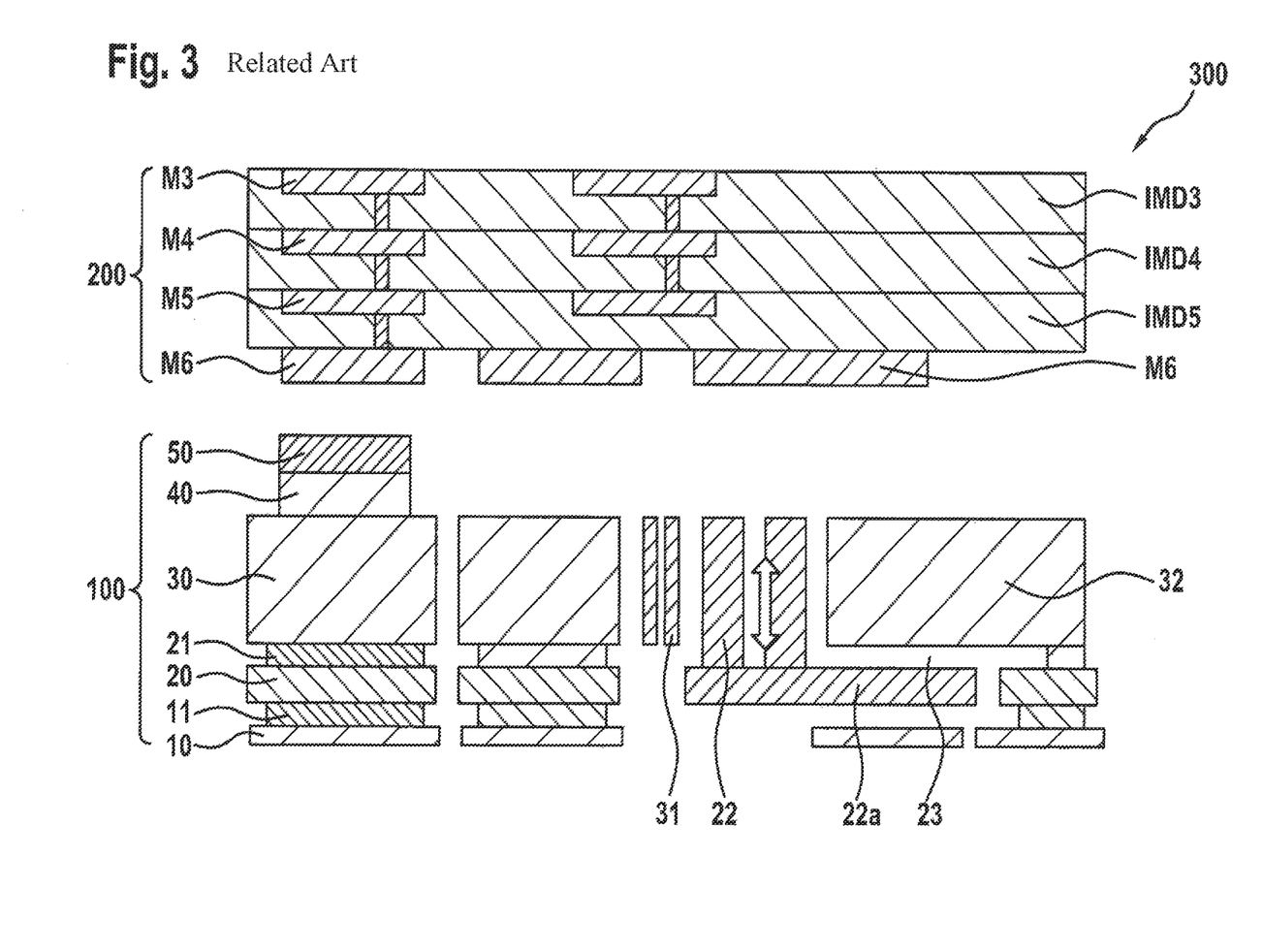
FIG. 3 is a partial view of the sensor device of FIG. 2.

ASIC element 200 has multiple wiring plies and insulating plies. For simplicity and better clarity, FIG. 3 depicts only some of the plies involved, in particular MEMS element 100 starting at first polysilicon layer 10. In addition, in all subsequent Figures the wafer stack is rotated again so that MEMS element 100 is located at the bottom and ASIC element 200 at the top. The portion in FIG. 3 corresponds substantially to the region B outlined with dashed lines in FIG. 2.

In contrast to MEMS element 100 of FIG. 1, MEMS element 100 of FIG. 3 has a further silicon layer in the form of a fourth polysilicon layer 40 that is disposed on third polysilicon layer 30 and functions as a spacer between the MEMS wafer and ASIC wafer. A first bonding layer, e.g. in the form of a germanium layer 50, which is located opposite corresponding structures (i.e. structures similar in terms of topology and area) in an uppermost metal plane M6 of ASIC element 200, is furthermore disposed on fourth polysilicon layer 40 in the region to be eutectically bonded.

After wafer bonding, a eutectic aluminum-germanium bonded join 70 is produced in the region of the bonding frame. The problem mentioned above regarding the mechanical robustness of MEMS element 100 still disadvantageously exists almost unchanged once bonding has been carried out, however, since a gap 23 between second polysilicon layer 20 and third polysilicon layer 30 is smaller than a gap between third polysilicon layer 30 and the M6 plane of ASIC element 200. Accordingly, abutment of MEMS element 200 between second and third polysilicon layers 20, 30 can disadvantageously occur here as well.

Provision is therefore made according to the present invention to provide for a local use of fourth polysilicon layer 40 and of first bonding layer 50 on MEMS wafer 100 in order to implement defined mechanical Z abutments on the movable sensing element 22. The uppermost metal layer M6 on the ASIC side is removed in the region of the abutments. This produces small residual gaps between MEMS element 100 and ASIC element 200, which are smaller than the gaps between the functional polysilicon planes in MEMS element 100 (first to third polysilicon layers 10, 20, 30).

Because of the small residual gap between MEMS element 100 and ASIC element 200, in an abutment event the movable MEMS structure can advantageously abut against ASIC element 200 and no longer against the highly breakage-susceptible polysilicon layers. The mechanical robustness of the overall MEMS structure is thereby advantageously enhanced.

Because abutment occurs in defined fashion onto an insulating layer IMD5, electrical short circuits also advantageously cannot occur. The result is that the (in some circumstances very laborious) rewiring of Z abutments in MEMS element 100, which abutments must have the same electrical potential as the movable mass in order to avoid short circuits, can advantageously be omitted.

Figure 4:
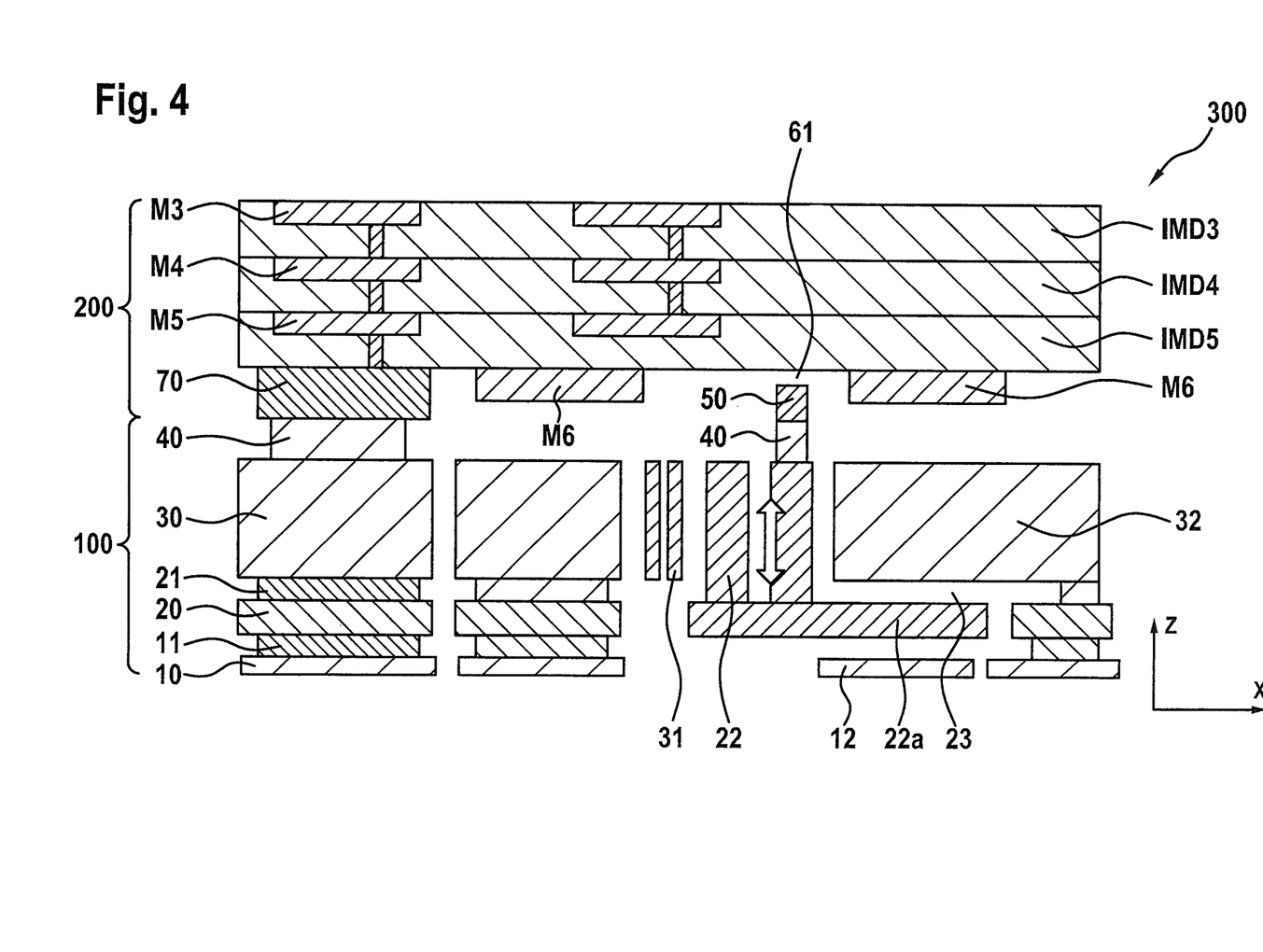
FIG. 4 is a cross-sectional view of an embodiment of a sensor device according to the present invention.
Figure 5:
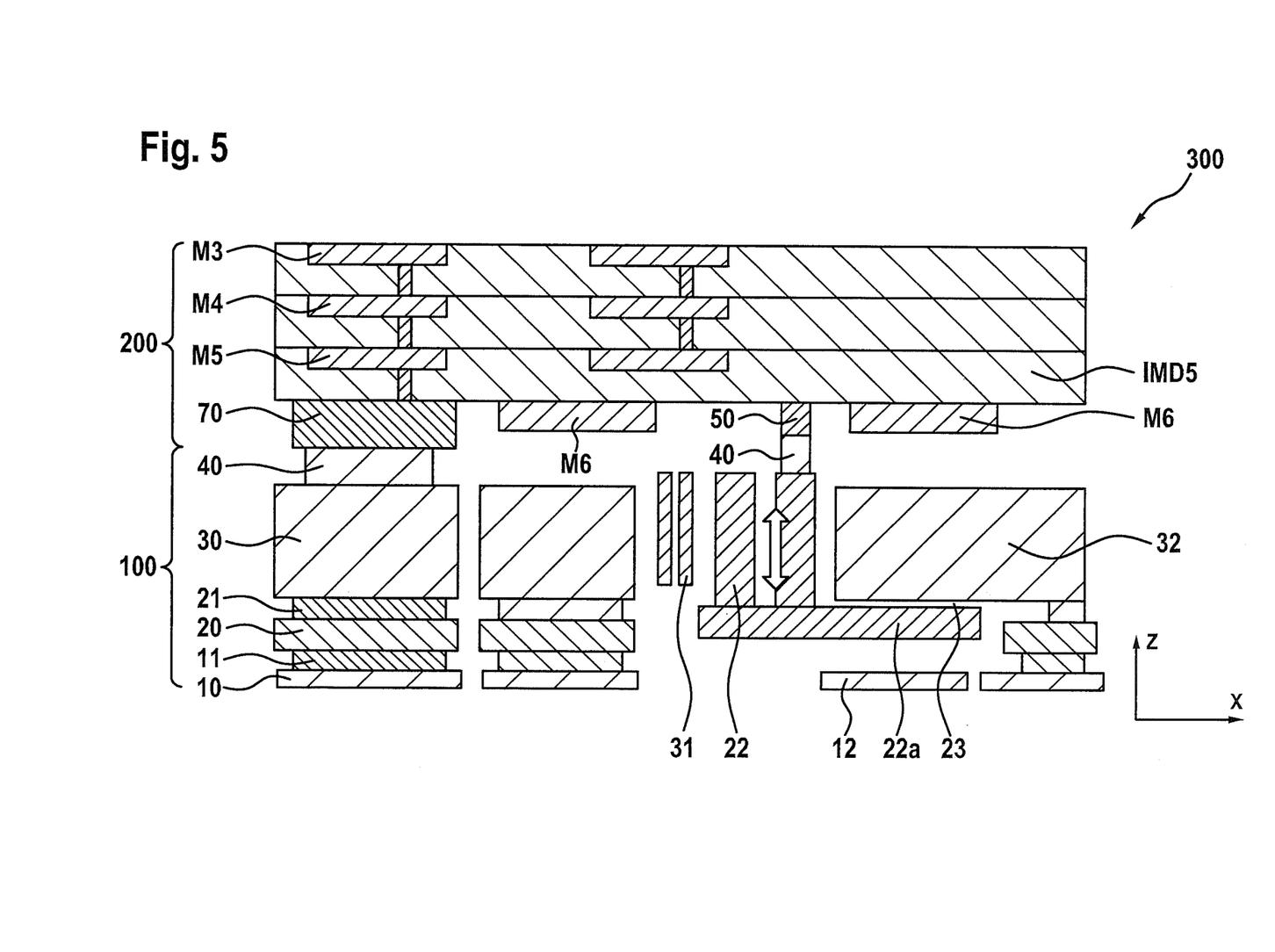
FIG. 5 is a cross-sectional view through the sensor device of FIG. 4 in an abutment event.

FIG. 4 shows this assemblage according to the present invention, in which a Z abutment is disposed on fourth polysilicon layer 40 and on first bonding layer 50 on a sub-region of the movable third polysilicon layer 30. The resulting residual gap 61 between germanium layer 50 and insulating ply IMD5 on the ASIC element 200 side is now smaller than gap 23 between second and third polysilicon layer 20, 30. In a context of large vertical deflections the first mechanical abutment therefore occurs at abutment structure 40, 50 and no longer between polysilicon layers 20, 30, as indicated schematically in FIG. 5. It is apparent that portion 22a, constituted orthogonally in the Z abutment direction, of sensing element 22 is at a distance from electrode 32 even though the abutment event has already occurred.

A further embodiment of the sensor device is notable for the fact that the nonconductive material IMD5 in the abutment region of ASIC element 200 is an oxide material. Because of the fact that the MEMS structure is at a defined potential when it abuts upward, there is thus nevertheless no short circuit. If abutment were to occur on metal, conversely, the potential of the metal would need to be the same as the potential of the MEMS structure in order to reliably avoid damage.

Advantageously, the invention is not limited to MEMS elements 100 having partly overlapping regions of second and third polysilicon layer 20, 30, but can instead usefully be used for other assemblages as well.

Figure 6:
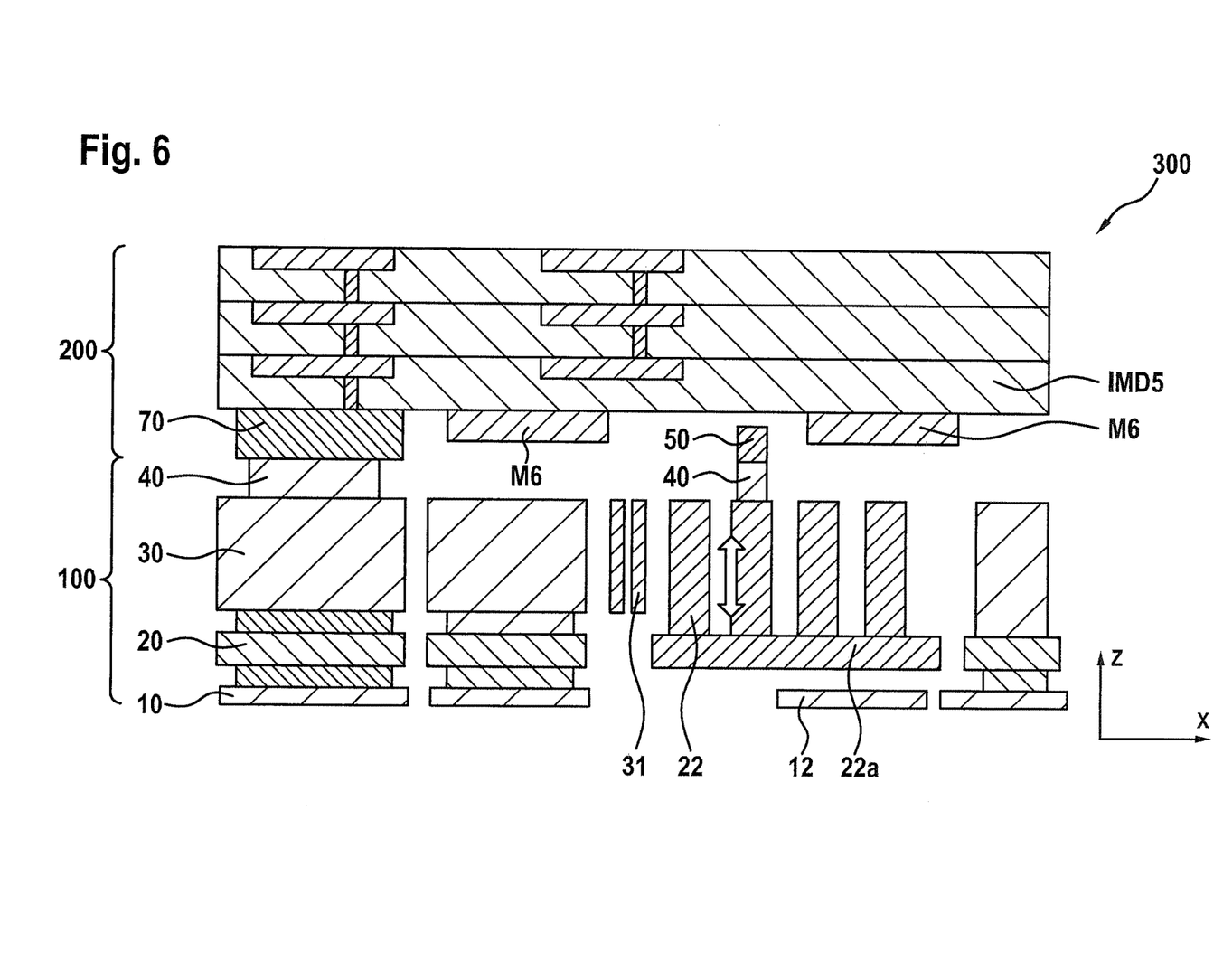
FIGS. 6 and 7 show further embodiments of the sensor device according to the present invention.

FIG. 6 shows a MEMS element 100 that is likewise constituted by elements of second and third polysilicon layer 20, 30, but does not have a counterelectrode or a Z abutment in third polysilicon layer 30. It does, however, possess a counterelectrode in the uppermost metal plane M6 of ASIC element 200. In this case the disposition according to the present invention of the abutment, with the disposition of fourth polysilicon layer 40 and germanium layer 50, is advantageous for preventing an electrical short circuit between the movable MEMS structure and the ASIC counterelectrode under a large mechanical overload.

Figure 7:
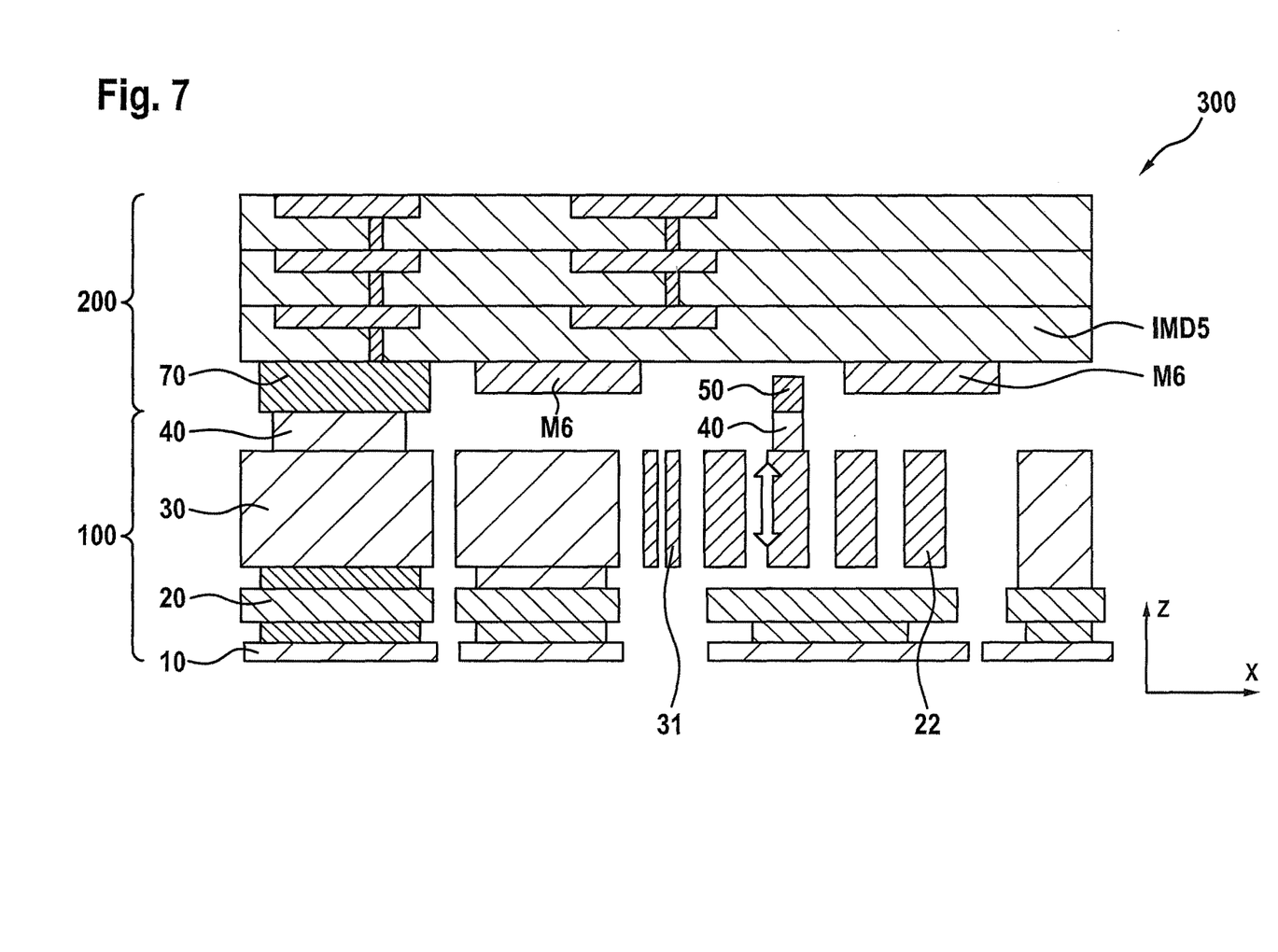

FIG. 7 shows an assemblage similar to that in FIG. 6, the only difference being that in this case movable MEMS element 100 is implemented only in third polysilicon layer 30. The advantages are the same as those described above in connection with FIG. 6.

Figure 8:
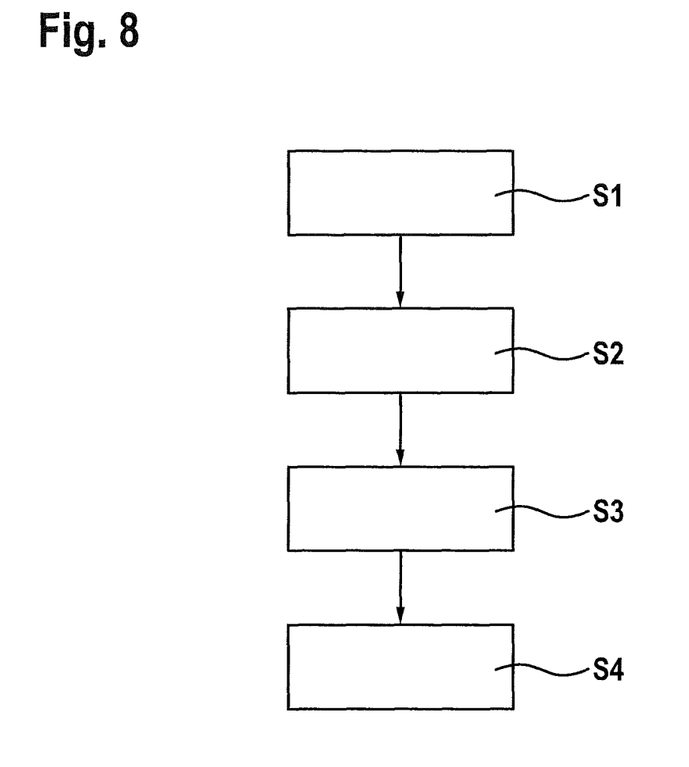
FIG. 8 is a schematic flow chart of an embodiment of the method according to the present invention.

FIG. 8 schematically shows the execution of an embodiment of the method for manufacturing a micromechanical sensor device 300.

In a first step S1, a MEMS element 100 is furnished.

In a second step S2, an ASIC element 200 is furnished.

In a third step S3, a constitution of a sensing element 22 in MEMS element 100 is carried out, an abutment element 40, 50 being disposed on sensing element 22, an insulating layer IMD5 being constituted in an abutment region for abutment element 40, 50 on ASIC element 200.

Lastly, in a fourth step S4 a bonding structure 70 is constituted between MEMS element 100 and ASIC element 200.

In summary, the present invention proposes a micromechanical sensor device, and a method for manufacturing a micromechanical sensor device, with which defined abutment for the sensor device is advantageously furnished. This is particularly advantageous in a context of greatly elevated acceleration forces that can occur when electronic devices impact against the floor. Damage to the sensitive MEMS structures can thereby advantageously be avoided. The aforesaid forces can also occur as a result of severe vibration when chips are singulated, and are mitigated according to the present invention.

Although the invention has been described above with reference to specific exemplifying embodiments, it is in no way limited thereto. One skilled in the art will thus be able to suitably modify the features described, or combine them with one another, without deviating from the essence of the invention.

What is claimed is:

1. A micromechanical sensor device, comprising:
   a MEMS element;
   an ASIC element;
   a bonding layer provided between the MEMS element and the ASIC element;
   a layer assemblage having at least one insulating layer and at least one functional layer disposed alternatingly on one another, wherein a sensing element movable in a sensing direction is provided in the at least one functional layer;
   a spacing element for providing a defined spacing between the MEMS element and the ASIC element, wherein the spacing element is provided in a further functional layer; and
   an abutment element comprising a first portion of the spacing element and a first portion of the bonding layer is formed on the sensing element so that the abutment element moves in the sensing direction along with the sensing element whenever the sensing element moves in the sensing direction,
     wherein an insulating layer is disposed on the ASIC element in an abutment region of the abutment element,
     wherein the first portion of the bonding layer has an abutment surface facing the ASIC element,
     wherein the insulating layer has a surface facing the MEMS element, and
     wherein, when the sensing element deflects to a maximum deflection, the abutment surface of the first portion of the bonding layer contacts the surface of the insulating layer facing the MEMS element.

2. The micromechanical sensor device recited in claim 1, wherein the sensing element has a portion provided orthogonally to the sensing direction, and wherein the abutment element is formed on the portion of the sensing element that is orthogonal to the sensing direction.

3. The micromechanical sensor device as recited in claim 2, further comprising:
at least one electrode interacting with the sensing element.

4. The micromechanical sensor device as recited in claim 3, wherein a spacing of the abutment element with respect to the ASIC element is larger than a detection gap with respect to the electrode.

5. The micromechanical sensor device as recited in claim 3, wherein the spacing element has a polysilicon layer.

6. The micromechanical sensor device as recited in claim 3, wherein the bonding layer is one of germanium, aluminum, or metal.

7. The micromechanical sensor device as recited in claim 3, wherein the insulating layer is an oxide material.

8. The micromechanical sensor device as recited in claim 3, wherein the sensing element is provided in a single functional layer.

9. A method for manufacturing a micromechanical sensor device, comprising:
providing a MEMS element;
providing an ASIC element;
providing a sensing element in the MEMS element, wherein the sensing element is movable in a sensing direction;
providing a bonding layer between the MEMS element and the ASIC element;
providing an abutment element comprising a first portion of the spacing element and a first portion of the bonding layer,
wherein the abutment element is formed on the sensing element so that the abutment element moves in the sensing direction along with the sensing element whenever the sensing element moves in the sensing direction,
wherein an insulating layer is provided on the ASIC element in an abutment region for the abutment element,
wherein the first portion of the bonding layer has an abutment surface facing the ASIC element,
wherein the insulating layer has a surface facing the MEMS element, and
wherein, when the sensing element deflects to a maximum deflection, the abutment surface of the first portion of the bonding layer contacts the surface of the insulating layer facing the MEMS element.

10. The method for manufacturing a micromechanical sensor device as recited in claim 9, wherein the sensing element has a portion provided orthogonally to the sensing direction, and wherein the abutment element is formed on the portion of the sensing element that is orthogonal to the sensing direction.

11. The micromechanical sensor device as recited in claim 1, further comprising:
a bonding structure that electrically connects the ASIC element and the MEMS element, wherein bonding structure is a eutectic mixture of a second portion of the bonding layer and a metal layer of the ASIC element.

12. The method for manufacturing a micromechanical sensor device as recited in claim 9, further comprising:
providing a bonding structure that electrically connects the ASIC element and the MEMS element, wherein the bonding structure is a eutectic mixture of a second portion of the bonding layer and a metal layer of the ASIC element.

* * * * *